United States Patent
Yen et al.

(10) Patent No.: US 6,236,327 B1
(45) Date of Patent: May 22, 2001

(54) WAFER-FETCHING SENSING DEVICE FOR WAFER STORAGE APPARATUS

(75) Inventors: Tai-Yu Yen, TaiNan; Wen-Wang Tsai, Hsinchu, both of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/252,489

(22) Filed: Feb. 18, 1999

(30) Foreign Application Priority Data

Jan. 12, 1999 (TW) ................................. 88200377

(51) Int. Cl.$^7$ ................................................ G08B 21/00
(52) U.S. Cl. .................. 340/673; 340/556; 250/559.43; 250/559.12; 414/935
(58) Field of Search ..................... 340/673, 679, 340/686.1, 555, 556; 250/222.1, 223 R, 559.43, 559.12; 414/331, 217, 416, 222, 226, 273, 274, 609, 936, 935; 118/719

(56) References Cited

U.S. PATENT DOCUMENTS

| 4,803,373 | * | 2/1989 | Imamura | 250/561 |
|---|---|---|---|---|
| 4,895,486 | * | 1/1990 | Baker | 414/331 |
| 5,225,691 | * | 7/1993 | Powers | 250/561 |
| 5,466,945 | * | 11/1995 | Brickell | 250/559.12 |
| 5,690,744 | * | 11/1997 | Landau | 118/715 |

\* cited by examiner

Primary Examiner—Jeffery Hofsass
Assistant Examiner—Anh La
(74) Attorney, Agent, or Firm—Bacon & Thomas

(57) ABSTRACT

A wafer-fetching sensing device for wafer storage apparatus uses a planar detection means to replace a conventional linear detection means to detect if a wafer is properly positioned at a desirable access level before being moved out of an access opening of the wafer storage apparatus by a robot. Wafer tilting and damage incident that might otherwise happen thus may be avoided. Only a correctly positioned wafer will be fetched. A warning signal will be generated when the wafer is not properly positioned so that preventive action may be taken to avoid wafer damage. Production yield thus may be increased.

3 Claims, 3 Drawing Sheets

WAFER-FETCHING SENSING DEVICE FOR WAFER STORAGE APPARATUS

BACKGROUND OF THE INVENTION

1. Field of the Invention

This invention relates to a wafer-fetching sensing device for wafer storage apparatus, and more particularly to an apparatus that upgrades the wafer positioning detection from a linear sensing level to a plane sensing level for increasing the production yield.

2. Description of the Prior Art

In semiconductor industry, transportation and storage of wafers in the IC fabrication process usually involve a wafer storage apparatus for storing a plural number of wafers and a robot for fetching the wafer. The wafers are arranged, at a predetermined order, into the wafer storage apparatus before an automation process can begin. In a fabrication site, the wafer storage apparatus usually locates beside a workstation or a group of workstations, and includes a wafer access opening for the robot to access and fetch the wafer thereinside.

FIG. 1 illustrates a conventional wafer storage apparatus 1 which includes a housing 100 providing an interior accommodation space 11 for orderly storing a plurality of wafers 3 therein; for example, to store wafers 3 upon a plurality of movable racks 13. By providing the movable racks 13, the wafers 3 then can be sequentially fetched out by the robot, through an access opening 50 of the housing 100, where the access opening 50 is arranged parallel to a normal storage state of wafer 3.

In order to make sure that each wafer 3 in the wafer storage apparatus 1 can be fetched out through the access opening 50 safely and right at an acceptable access level 10 formed parallel to the normal storage state of wafers 3, a first sensor unit 5 is installed at the access opening 50 for sensing whether or not the wafer 3 is posed by the normal storage state at the access level 10. Generally, the access opening 50 and the access level 10 is coplanar.

Referring now to FIG. 2, the first sensor unit 5 includes a first emitter 17 located at the access opening 50 for sending a signal to a first receiver 15 along a first measuring line 101 on the access level 10. The first measuring line 101 may coincide with the center axis of the access opening 50. When the first sensor unit 5 detects the wafer 3 is properly positioned and leveled, the robot may proceed to start the fetching operation to move out the wafer 3 through the access opening 50.

However, there are some occasions in which a wafer 3 may be improperly positioned and may deviate from its normal state upon the rack 13. Upon occurring such an occasion, a wafer-fetching problem that the first sensor unit 5 fails to detect the misplacement may arise. FIG. 3 illustrates one of such occasions. Due to any possible operation error (e.g. by putting the wafer 3a with two lateral sides anchored at different levels of racks 13, the wafer 3a is tilted about the first measuring line 101 (also symbolized by the position of the first receiver 15) in the center of the access level 10, and forms an angle with the access level 10, but still keeps the center line of the tilted wafer 3a coinciding with the first measuring line 101. Under such a situation shown in FIG. 3, the first sensor unit 5 can still decide that the wafer 3a is posed at the normal storage state, and then proceeds to issue a normal signal for the robot to fetch out the wafer 3a. However, both lateral sides of the wafer 3a have deviated from the access level 10 and thus may result in the wafer 3a hitting the storage wall of the housing 10 or dropping to the floor, while being fetched out. It may cause damage (either minor or major) to the wafer 3a or even sequentially shut down whole production operation.

SUMMARY OF THE INVENTION

In view of aforesaid disadvantages, it is therefore an object of this invention to provide a wafer-fetching sensing device for wafer storage apparatus capable of detecting if a wafer is correctly positioned for fetch out from the wafer storage apparatus, so that wafer damage incident may be avoided.

It is another object of this invention to provide a wafer-fetching sensing device for wafer storage apparatus that enhances the wafer level detection from conventional linear mode to a planar mode, so that the wafer level detection accuracy can be greatly improved, the wafer damage problem can be greatly reduced, and the total production yield can be increased.

The apparatus according to this invention uses a planar detection means at the access level of the access opening of the wafer storage apparatus to make sure that a wafer is precisely positioned by a normal storage state before moving the robot to fetch the wafer. The planar detection means implements a second sensor unit besides the first sensor unit of a conventional one set forth above. There are two pairs of emitters and receivers for measuring two spaced (and preferably parallel) measuring lines on the access level of the wafer. Thus, the wafer-tilting problem may be easily detected and alarmed before any further damage occurs. Wafer damage and production interruption problem thus may be reduced, and production yield may be enhanced.

BRIEF DESCRIPTION OF THE DRAWINGS

The invention, as well as its many advantages, may be further understood by the following detailed description and drawing in which.

DETAILED DESCRIPTION OF THE PREFERRED EMBODIMENT

Figure 1:
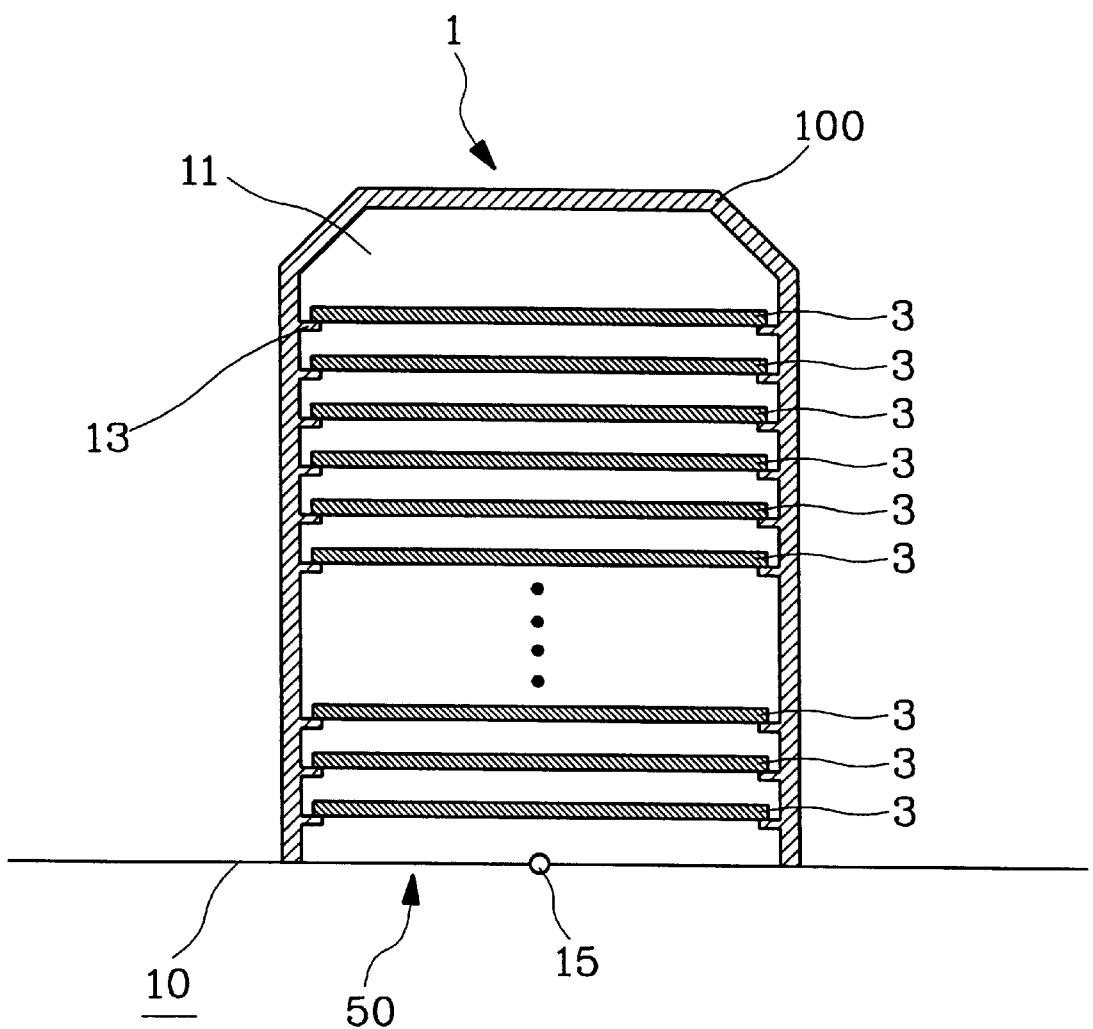
FIG. 1 is a schematic sectional view of a conventional wafer storage apparatus.
Figure 2:
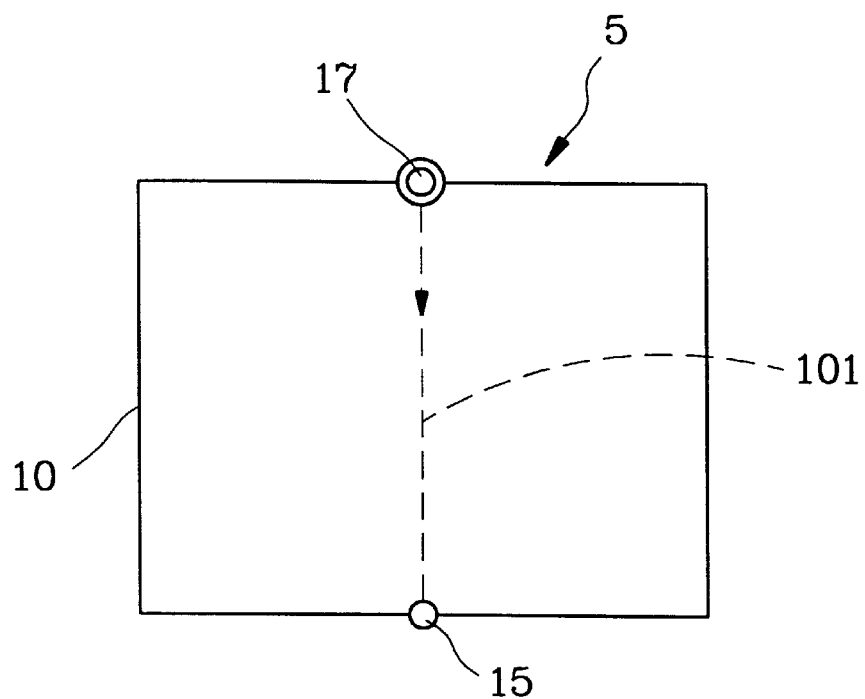
FIG. 2 is a schematic plane view of a conventional wafer-fetching sensing device.
Figure 3:
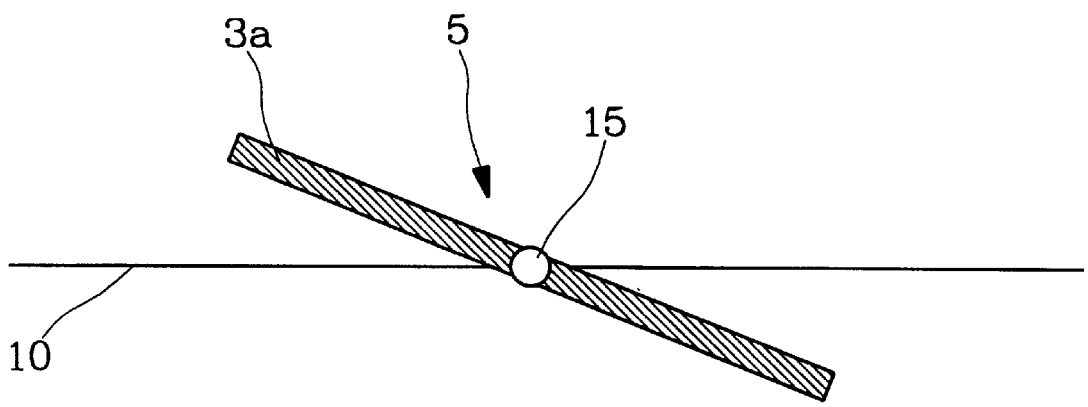
FIG. 3 is a schematic sectional view of a tilting wafer under a conventional wafer-fetching sensing device.
Figure 4:
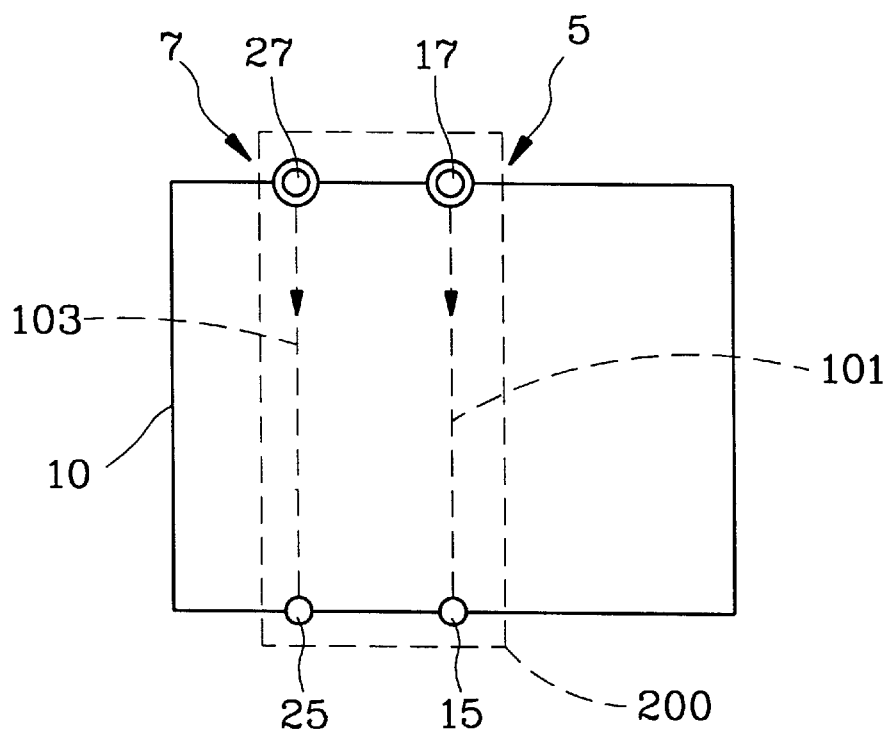
FIG. 4 is a schematic plane view of this invention.

The wafer-fetching sensing device for wafer storage apparatus according to this invention uses a planar detection means to measure and detect if a wafer is positioned correctly for safely moving through an access opening to replace a conventional linear detection means. Referring to FIGS. 1 and 4, the wafer storage apparatus 1 is constructed largely like a conventional one shown in FIG. 1 except that a planar detection means 200 is located at the access opening 50 for measuring purpose on the access level 10.

The plane detection means 200 includes a first sensor unit 5 which comprises a first emitter 17 and a first receiver 15 for measuring along a first measuring line 101, and a second sensor unit 7 which comprises a second emitter 27 and a second receiver 25 for measuring along a second measuring line 103, in which the second measuring line 103 is spaced from and preferably parallel with the first measuring line 101. Both the first and second measuring lines 101 and 103 are located on the access level 10. By providing the first and the second sensor units 5 and 7, only a wafer aligned with the access level 10 can induce the planar detection means 200 to generate correct signals for a robot to fetch out the wafer from the wafer storage apparatus without alarming.

According to the present invention, the sensor units 5 and 7 can be embodied as a combination of optical emitters and receivers as described above. However, they can also apply any precise measuring means with plane locating capability; such as a probe with its sensing tip on the access level 10.

According to the present invention, the arrangement of the first and the second measuring lines 101 and 103 can be two parallel lines as shown in FIG. 4, yet they can also be embodied as two non-intersecting or intersecting lines on the access level 10 by which a plane can be determined.

Figure 5:
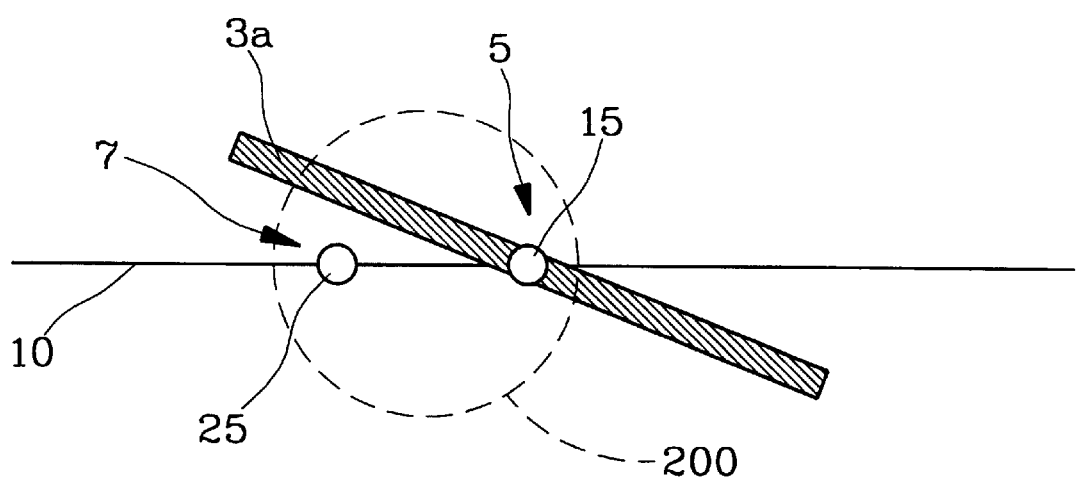
FIG. 5 is a schematic sectional view of a tilting wafer under this invention.

Referring now to FIG. 5, when a wafer 3a tilts about the access level 10, the first measuring line 101 may still decide that the wafer coincides with the access level 10, but the second sensor unit 7 can detect that the wafer 3a has already deviated from the access level 10. Thus, by combining the detection results from the first and the second sensor units 5 and 7, an abnormal signal can be generated for the robot to stop the fetching operation.

In another aspect of this invention, a warning means (not shown in figures) may be included to alert the abnormal situation set forth above so that operator may take prompt action to fix the problem.

It may thus be seen that the objects of the present invention set forth herein, as well as those made apparent from the foregoing description, are efficiently attained. While the preferred embodiments of the invention has been set forth for purpose of disclosure, modifications of the disclosed embodiments of the invention as well as other embodiments thereof may occur to those skilled in the art. For instance, the first measuring line may be located at other located of the access level rather than at the center line of the access opening. The sensor unit may consist of other types sensing device for detecting a plane rather than a pair of emitter and receiver. Accordingly, the appended claims are intended to cover all embodiments which do not depart from the spirit and scope of the invention.

What is claimed is:

1. A wafer-fetching sensing device for wafer storage apparatus, said wafer-fetching sensing device being capable of detecting whether a wafer is properly located in a wafer access opening of the wafer storage apparatus for fetching out therefrom, comprising:

a first emitter located at the access opening for generating a first measuring line to measure a wafer position against the access opening;

a first receiver spaced from the first emitter for receiving the first measuring line from the first emitter; and a sensor unit located at the access opening and spaced from the first emitter and receiver for coupling with the first emitter and receiver to detect if the wafer being located at a predetermined access level; the sensor unit generates a second measuring line located on the predetermined access level, and the second measuring line being parallel with and apart from the first measuring line, wherein the wafer is properly located in the wafer access opening when both the first measuring line and second measuring line are obstructed by the same wafer;

and wherein the wafer is not properly located in the wafer access opening when at least one measuring line is not obstructed by the wafer.

2. The wafer-fetching sensing device of claim 1, wherein the sensor unit includes a second emitter and a second receiver.

3. The wafer-fetching sensing device of claim 1, further having a warning means for generation an alarm signal when the sensor unit detects the wafer does not located on the selected access level.

\* \* \* \* \*